United States Patent
Nishiguchi et al.

(10) Patent No.: US 7,173,273 B2
(45) Date of Patent: Feb. 6, 2007

(54) SEMICONDUCTOR LASER DEVICE

(75) Inventors: Harumi Nishiguchi, Tokyo (JP); Tetsuya Yagi, Tokyo (JP); Yasuaki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/700,047

(22) Filed: Nov. 4, 2003

(65) Prior Publication Data

US 2004/0108508 A1    Jun. 10, 2004

(30) Foreign Application Priority Data

Nov. 6, 2002 (JP) .............. 2002-322380

(51) Int. Cl.
*H01L 29/06* (2006.01)
*H01L 27/15* (2006.01)
*H01L 29/22* (2006.01)

(52) U.S. Cl. .............. 257/17; 257/79; 257/94
(58) Field of Classification Search .............. 257/79, 257/170, 82
See application file for complete search history.

(56) References Cited

U.S. PATENT DOCUMENTS 5,420,066 A * 5/1995 Shima et al. .............. 438/40
5,903,585 A   5/1999 Dawson et al.
6,127,691 A * 10/2000 Fukunaga et al. .............. 257/17
6,304,587 B1 * 10/2001 Zah .............. 372/46.01
6,424,668 B1 * 7/2002 Murayama .............. 372/45
2002/0061044 A1   5/2002 Kuniyasu et al.

FOREIGN PATENT DOCUMENTS

JP           10-125995        5/1998

OTHER PUBLICATIONS

M. Miyashita et al., "High-Power Operation of Low-Operating-Current 660nm Laser Diodes for DVD-RAM/RW," *OECC/IOOC 2001 Conference Incorp. ACOFT,* Jul. 2001, pp. 543-544.

* cited by examiner

*Primary Examiner*—Zandra V. Smith
*Assistant Examiner*—Kiesha Rose
(74) *Attorney, Agent, or Firm*—Leydig, Voit & Mayer, Ltd.

(57) ABSTRACT

A semiconductor laser device has an n-GaAs substrate. On the n-GaAs substrate, by turns, are an n-AlGaInP cladding layer, an AlGaInP/GaInP MQW active layer, a p-AlGaInP first cladding layer, a single layer p-$Al_xGa_{1-x}As$ etching stopping layer, a p-AlGaInP second cladding layer with a stripe protrusion, and a p-GaAs contact layer. The portion, other than the stripe-form protrusion, of the p-AlGaInP second cladding layer is covered with an insulating film. The refractive index of the p-$Al_xGa_{1-x}As$-ESL is nearly equal to the refractive index of each of the lower, first upper, and second upper cladding layers.

10 Claims, 6 Drawing Sheets

SEMICONDUCTOR LASER DEVICE

BACKGROUND OF THE INVENTION

1. Field of the Invention

The present invention relates to a semiconductor laser device which is used for an optical disk system, an optical communication system or the like.

2. Description of the Related Art

A semiconductor laser device, which is designed to emit a laser beam by electron transition in a compound semiconductor having p-n junctions, provides a low driving voltage as compared to a solid-state laser device or a gas laser device, while it is small-size and lightweight. Therefore, it has been extensively used as a laser beam source for an optical disk system, an optical communication system or the like.

For example, the semiconductor laser device described above has a construction as follows. That is, on a substrate composed of n-type (referred to as "n-" hereinafter) GaAs, there are provided, by turns, a lower clad layer composed of n-AlGaInP, an active layer having a multiple quantum well structure, a first upper clad layer composed of p-type (referred to as "p-" hereinafter) AlGaInP, an etching stopper layer (sometimes referred to as "ESL" hereinafter) with a multiple quantum well structure composed of p-AlGaInP and GaInP, a second upper clad layer composed of p-AlGaInP and having a stripe-form protrusion, a contact layer composed of p-GaAs, and a p-electrode (for example, see Japanese laid-open patent publication No. Hei 10-125995 (paragraph [0016] and FIG. 1)). The top surface of the second upper clad layer is covered with an insulative film except the portion corresponding to the stripe-form protrusion.

Meanwhile, because the conventional semiconductor laser device, for example described in the above-mentioned publication, includes the etching stopper layer with the multiple quantum well structure composed of p-AlGaInP and GaInP, luminous efficiency is lowered. According to knowledge of the present inventors, it is assumed that the luminous efficiency is lowered by about 7% in the event that the etching stopper layer is provided, as compared to the case in which no etching stopper layer is provided (see FIG. 10 discussed later).

This is because providing the etching stopper layer enables the light distribution, which should be concentrated to the active layer, to expand on the upper clad layer side (see FIG. 7 later discussed) and light absorption occurs in the contact layer and so on. However, absence of the etching stopper layer causes such a problem that the selective etching for forming the stripe-form protrusion is unable to be properly carried out on the second upper clad layer.

In general, light absorption at the contact layer composed of p-GaAs can be prevented or suppressed, if the thickness of the second upper clad layer composed of p-AlGaInP is increased to prevent the light distribution from reaching the contact layer. In an index guide laser provided with a light-guiding structure, a laser beam is confined due to the difference of refractive indexes between the second upper clad layer composed of p-AlGaInP with the stripe-form protrusion and the layers on both sides, at the second upper clad layer. If a clad layer composed of a material with high resistivity is used, the resistance of the stripe-form protrusion is increased and the output characteristics or temperature characteristics at the time of high output may be deteriorated.

SUMMARY OF THE INVENTION

The present invention, which has been achieved to solve the conventional problems described above, has an object to provide a means which can form a stripe-form protrusion on an upper clad layer of a semiconductor laser device without troubles, which can suppress or prevent the spread of light distribution toward the upper clad layer side, and which can reduce light dip-out or light absorption to a contact layer and so on.

A semiconductor laser device according to the present invention which has been achieved to solve the above-mentioned problems, includes an active layer. A lower clad layer is located below the active layer, while a first upper clad layer is located above the active layer. An etching stopper layer is located above the first upper clad layer. A second upper clad layer is located above the etching stopper layer. The second upper clad layer is provided with a stripe-form protrusion. Thus, a stripe-form light-guiding channel is formed below the protrusion. The etching stopper layer is formed as a single layer and is composed of a material different from that of each of the clad layers. In addition, the etching stopper layer has a refractive index nearly equal to that of each of the clad layers (or each of upper clad layers described above). Meanwhile, if any etching stopper layer is not provided, the second upper clad layer should be composed of a material which is different from the material of the first upper clad layer and has a refractive index nearly equal to that of the first upper clad layer.

In the semiconductor laser device according to the present invention, the single-layer etching stopper layer is composed of the material different from that of each of the clad layers and has the refractive index nearly equal to that of each of the clad layers. Due to that, the stripe-form protrusion can be formed on the second upper clad layer without troubles. In addition, the spread of the light distribution toward the upper clad layer side can be suppressed or prevented so that light dip-out or light absorption to the contact layer of GaAs and so on can be reduced.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which.

DESCRIPTION OF THE PREFERRED EMBODIMENTS

Hereinafter, referring to the drawings attached hereto, preferred embodiments of the present invention will be described.

(Embodiment 1)

Figure 1:
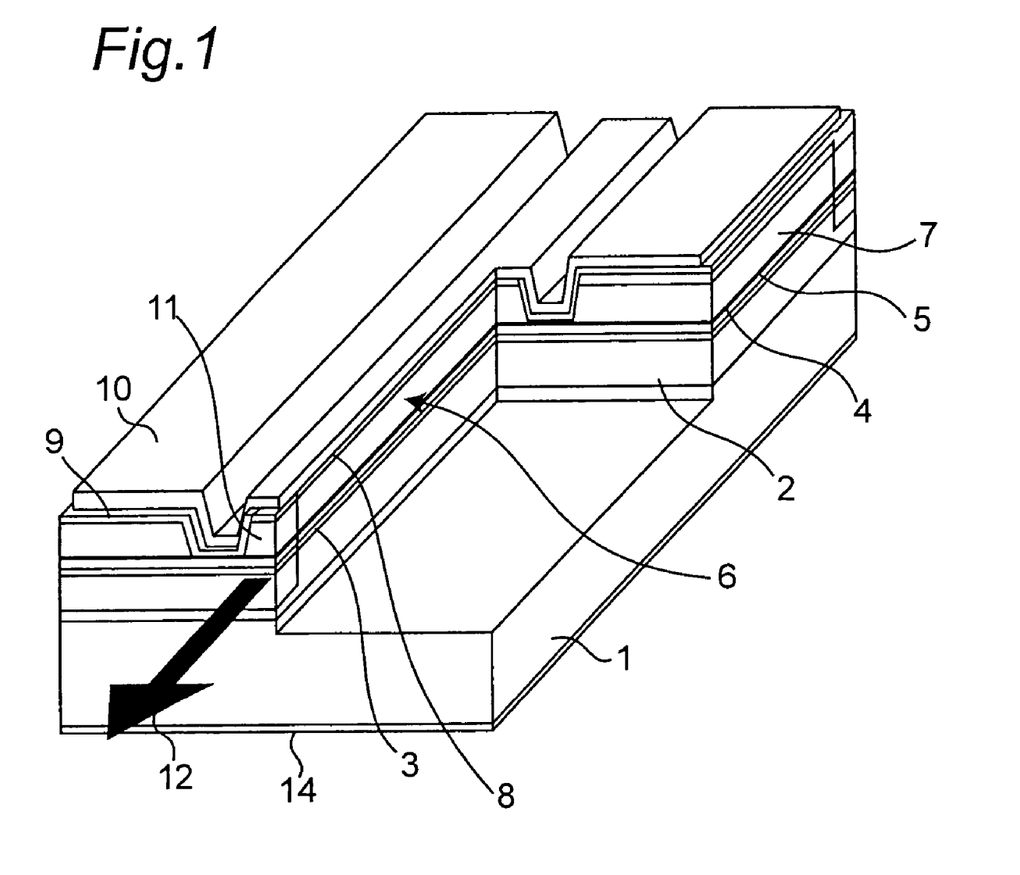
FIG. 1 is a perspective view of a semiconductor laser device according to Embodiment 1 of the present invention, which is partly cut away.
Figure 2:
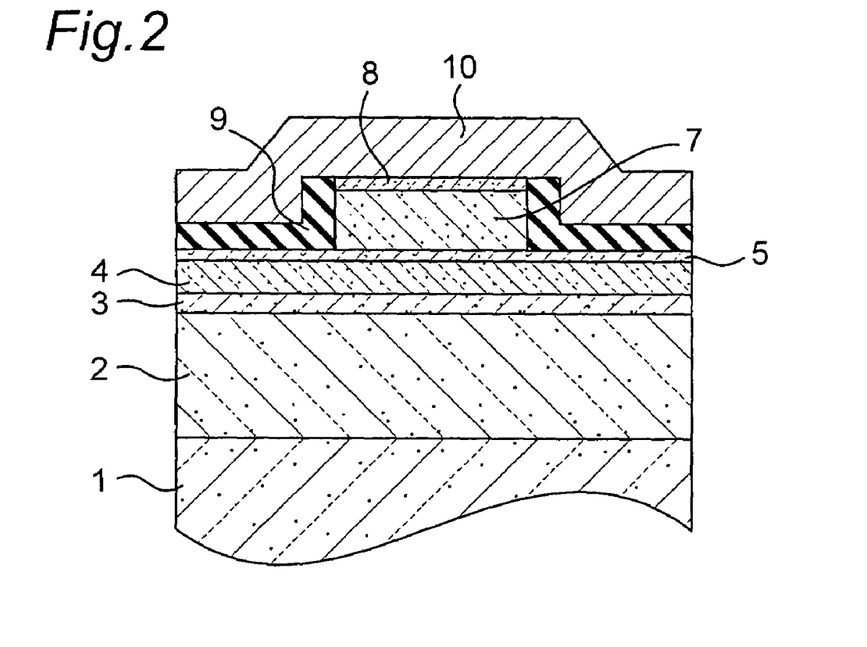
FIG. 2 is a sectional elevation view of the semiconductor laser device shown in FIG. 1.

FIG. 1 is a perspective view of a semiconductor laser device according to Embodiment 1 of the present invention. FIG. 2 is a sectional elevation view of the vicinity of a light-guiding channel of the semiconductor laser device shown in FIG. 1.

As shown in FIGS. 1 and 2, in the semiconductor laser device, on a substrate 1 substantially composed of (or containing) n-GaAs (referred to as "n-GaAs substrate 1" hereinafter), there are provided or laminated, by turns, a lower clad layer 2 substantially composed of (or containing) n-AlGaInP (referred to as "n-AlGaInP clad layer 2" hereinafter), an active layer 3 substantially composed of (or containing) AlGaInP and GaInP and having a multiple quantum well (referred to as "MQW" hereinafter) structure (referred to as "AlGaInP/GaInP MQW active layer 3" hereinafter), a first upper clad layer 4 substantially composed of (or containing) p-AlGaInP (referred to as "p-AlGaInP first clad layer 4" hereinafter), a single-layer etching stopper layer 5 substantially composed of (or containing) p-$Al_xGa_{1-x}$As (referred to as "p-$Al_xGa_{1-x}$As-ESL 5" hereinafter: x is the Al composition ratio in the range from 0 to 1), a second upper clad layer 7 substantially composed of (or containing) p-AlGaInP-and having a stripe-form protrusion 6 (referred to as "p-AlGaInP second clad layer 7" hereinafter), and a contact layer 8 substantially composed of (or containing) p-GaAs (referred to as "p-GaAs contact layer 8" hereinafter).

Except the portion corresponding to the stripe-form protrusion 6, the p-AlGaInP second clad layer 7 is covered with an insulative film 9. On the p-GaAs contact layer 8 and the insulative film 9, a p-electrode 10 is provided. In addition, on the lower surface (i.e. back surface) of the n-GaAs substrate 1, an n-electrode 14 is provided. Meanwhile, in the vicinity of an end face of the semiconductor laser device, an end-face window region 11 is formed.

In the semiconductor laser device, when voltage is applied between the p-electrode 10 and the n-electrode 14 so that current exceeding a threshold value flows from the p-electrode 10 to the n-electrode 14, laser oscillation is generated in the vicinity of the AlGaInP/GaInP MQW active layer 3 below the stripe-form protrusion 6 so that a laser beam 12 is generated. The laser beam 12 passes through a stripe-form light-guiding channel formed in the vicinity of the AlGaInP/GaInP MQW active layer 3 below the stripe-form protrusion 6, and then is emitted from the end-face window region 11 to the outside.

Although the single-layer p-$Al_xGa_{1-x}$As-ESL 5 is made of a material different from the material (AlGaInP) of each of the clad layers 2, 4 and 7 in the semiconductor laser device, the refractive index of the p-$Al_xGa_{1-x}$As-ESL 5 is nearly equal to that of each of the clad layers 2, 4 and 7. According to knowledge of the present inventors, it is concluded that if the Al composition ratio x in the p-$Al_xGa_{1-x}$As-ESL 5 is set in the range from 0.45 to 0.9, the refractive index of p-$Al_xGa_{1-x}$As becomes nearly equal to that of p-AlGaInP or n-AlGaInP. Thus, in the semiconductor laser device, the Al composition ratio x in the p-$Al_xGa_{1-x}$As-ESL 5 is set to 0.7.

The refractive index n of each of the layers 3, 4, 5 and 7 in the semiconductor laser device is given as follows.

AlGaInP/GaInP MQW active layer 3: n=3.65 (well layer)
p-AlGaInP first clad layer 4: n=3.39
p-$Al_xGa_{1-x}$As-ESL 5: n=3.38 (x=0.7)
p-AlGaInP second clad layer 7: n=3.39.

Meanwhile, in the etching stopper layer of MQW structure composed of p-AlGaInP and GaInP in a conventional semiconductor laser device, its refractive index n is nearly equal to that of the active layer, that is about 3.65.

Figure 4:
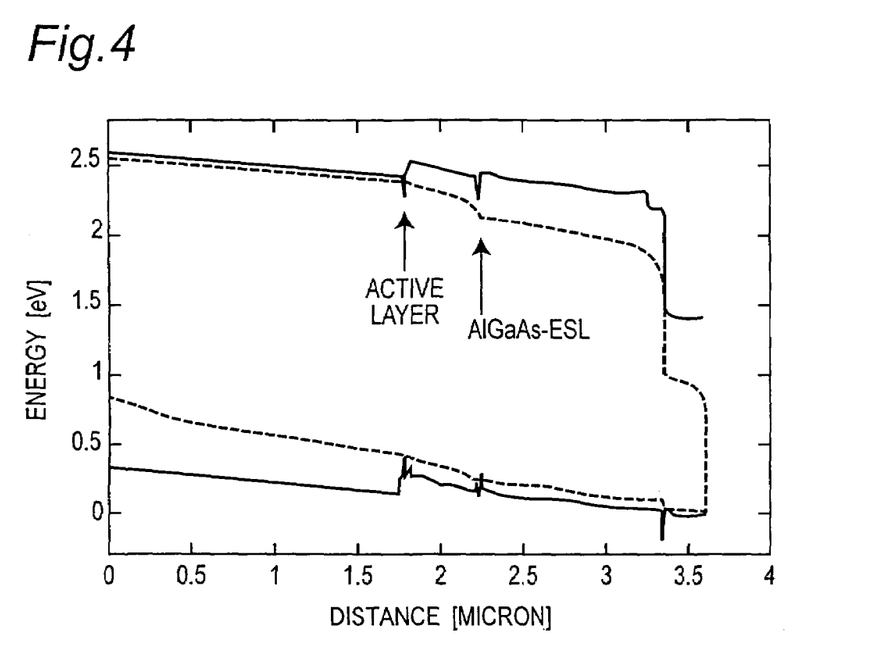
FIG. 4 is a graph showing the distribution of energy level or band gap energy in the semiconductor laser device according to Embodiment 1.
Figure 5:
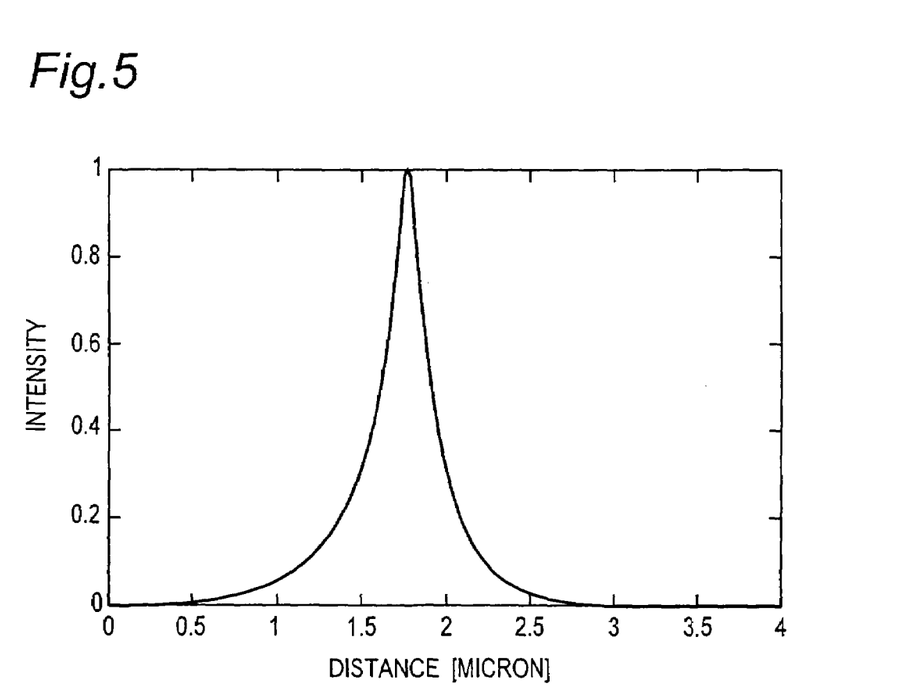
FIG. 5 is a graph showing the light distribution in the semiconductor laser device according to Embodiment 1.

In FIGS. 4 and 5, as for a semiconductor laser device according to Embodiment 1, there are shown, respectively, energy levels or band gap energy distribution (band structures) in the semiconductor laser device, and distribution of the laser beams in the semiconductor laser device (calculated results). Hereupon, the Al composition ratio x of p-$Al_xGa_{1-x}$As-ESL 5 is set to 0.7 while the layer thickness is set to 20 nm.

Figure 6:
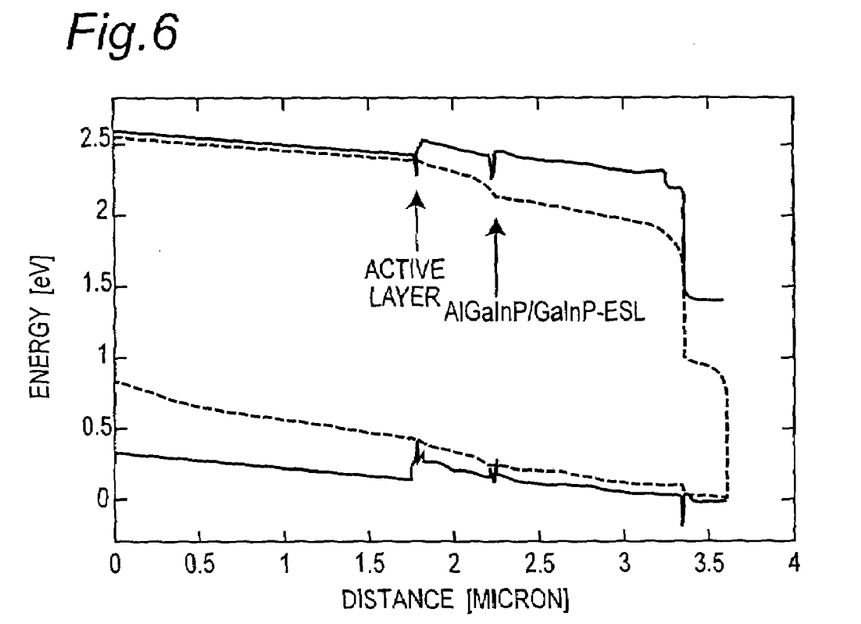
FIG. 6 is a graph showing the distribution of energy level or band gap energy in a conventional semiconductor laser device with ESL.
Figure 7:
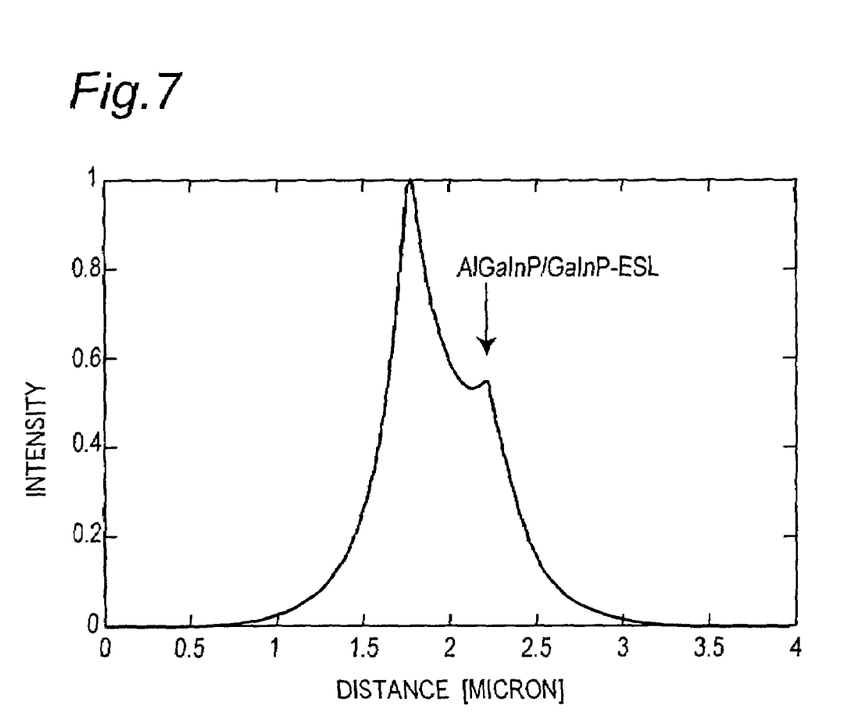
FIG. 7 is a graph showing the light distribution in the semiconductor laser device with ESL.

For comparison, in FIGS. 6 and 7, as for a semiconductor laser device provided with an etching stopper layer of MQW structure composed of p-AlGaInP and GaInP, there are shown, respectively, energy levels or band gap energy distribution in the semiconductor laser device, and distribution of the laser beams in the semiconductor laser device (calculated results).

Figure 8:
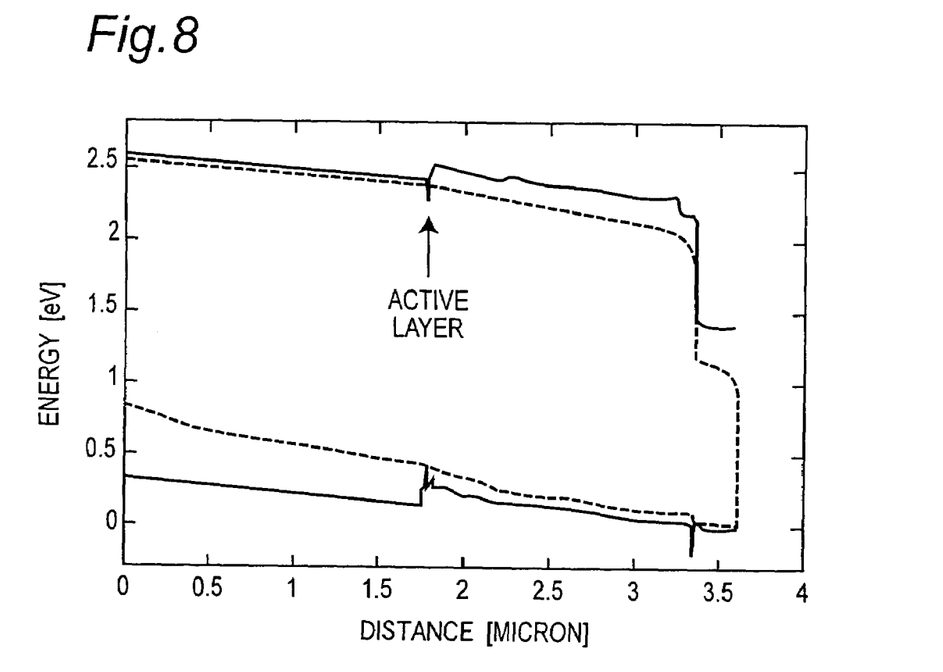
FIG. 8 is a graph showing the distribution of energy level or band gap energy in a regular semiconductor laser device with no ESL.
Figure 9:
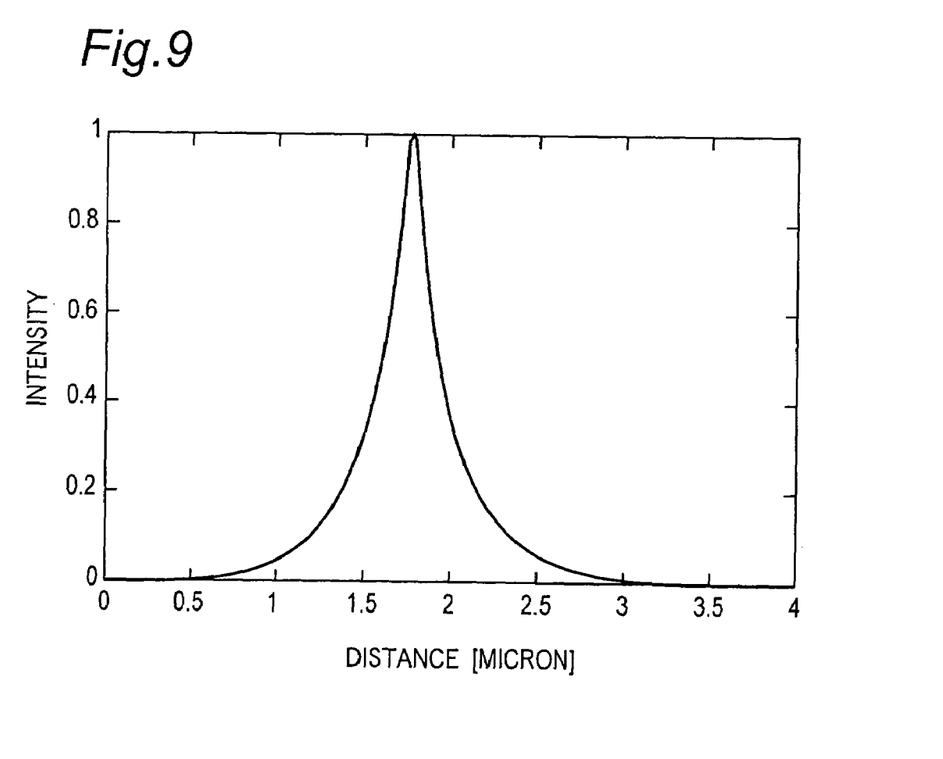
FIG. 9 is a graph showing the light distribution in the regular semiconductor laser device with no ESL.

For reference, in FIGS. 8 and 9, as for a regular semiconductor laser device with no etching stopper layer provided, there are shown, respectively, energy levels or band gap energy distribution in the semiconductor laser device, and distribution of the laser beams in the semiconductor laser device (calculated results).

Figure 10:
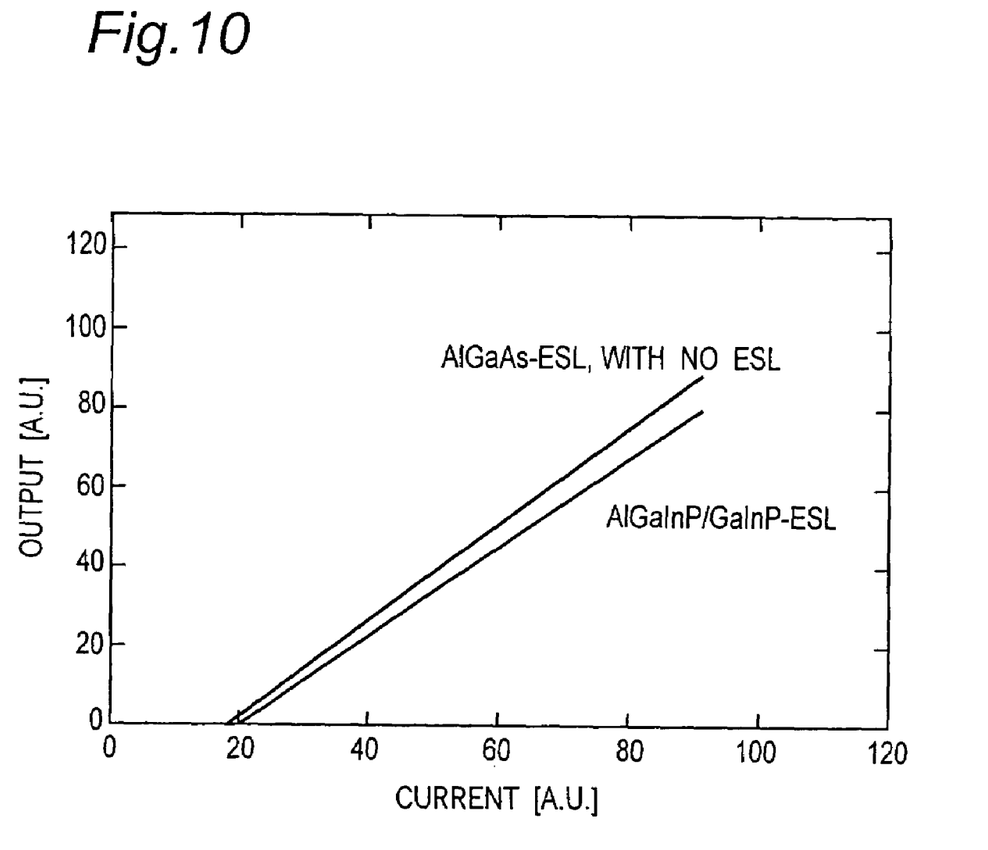
FIG. 10 is a graph showing the relationship between the optical power and the input current (P-I characteristics) in the semiconductor laser device (AlGaAs-ESL) according to Embodiment 1, the conventional semiconductor laser device (AlGaInP/GaInP-ESL) with ESL, and the regular semiconductor laser device with no ESL.

In addition, in FIG. 10, there is shown relationship between the optical power and the input current (P-I characteristics) in the semiconductor laser device (AlGaAs-ESL) according to Embodiment 1 and the conventional semiconductor laser device (AlGaInP/GaInP-ESL) with the etching stopper layer provided, and the regular semiconductor laser device (with no ESL) with no etching stopper layer provided (calculated results).

As apparent from FIGS. 6 and 7, in the conventional semiconductor laser device with the etching stopper layer of MQW structure composed of p-AlGaInP and GaInP, the light distribution expands on the upper clad layer side. On the other hand, as apparent from FIGS. 4 and 5, in the semiconductor laser device according to Embodiment 1, expansion of the light distribution to the upper clad layer side scarcely exists, which is as same as the case of the regular semiconductor laser device with no etching stopper layer provided (see FIGS. 8 and 9).

In addition, as apparent from FIG. 10, the luminous efficiency of the semiconductor laser device according to Embodiment 1 is as same as that of the regular semiconductor laser device with no etching stopper layer provided, and is about 7% better than that of the conventional semiconductor laser device with the etching stopper layer of MQW structure composed of p-AlGaInP and GaInP. In consequence, the semiconductor laser device according to Embodiment 1 is advantageous to achieve increased output (high power) and increased efficiency.

The above-mentioned calculated results for the semiconductor laser device according to Embodiment 1 are obtained when the Al composition ratio x of p-$Al_xGa_{1-x}$As-ESL 5 is set to 0.7. However, the same effects are able to be obtained if the Al composition ratio x is set in the range of 0.45 (n=about 3.57) to 0.9 (n=about 3.24).

Hereinafter, a manufacturing method of a semiconductor laser device will be described. In the manufacturing process of the semiconductor laser device, at first, by a crystal growth method such as the MOCVD method or the like, on an n-GaAs substrate 1, an n-AlGaInP clad layer 2, an AlGaInP/GaInP MQW active layer 3, a p-AlGaInP first clad layer 4, a p-$Al_xGa_{1-x}$As-ESL 5, a p-AlGaInP second clad layer 7, and a p-GaAs contact layer 8 are formed in that order. Then, in the vicinity of an end face of the semiconductor laser device, an end-face window region 11 is formed by disordering the AlGaInP/GaInP MQW active layer 3 by means of Zn diffusion. Further, by selectively etching the p-AlGaInP second clad layer 7 using a mask having a resist, an insulative film and so on, and provided with a specified pattern, a stripe-form protrusion 6 is formed.

In that occasion, for example, using an etchant of a sulfuric acid type or hydrochloric acid type, the p-AlGaInP second clad layer 7 is selectively etched. The etching is stopped when it has reached the p-$Al_xGa_{1-x}$As-ESL 5. Then, an insulative film 9 such as a nitride film or the like is formed. Furthermore, by a photo engraving process and an etching process, the insulative film 9 on the stripe-form protrusion 6 is removed to form an opening. Then, a p-electrode 10 and an n-electrode 14 composed of gold or the like are formed. Thus, the semiconductor laser device is completed.

(Embodiment 2)

Hereinafter, Embodiment 2 of the present invention will be described.

Figure 3:
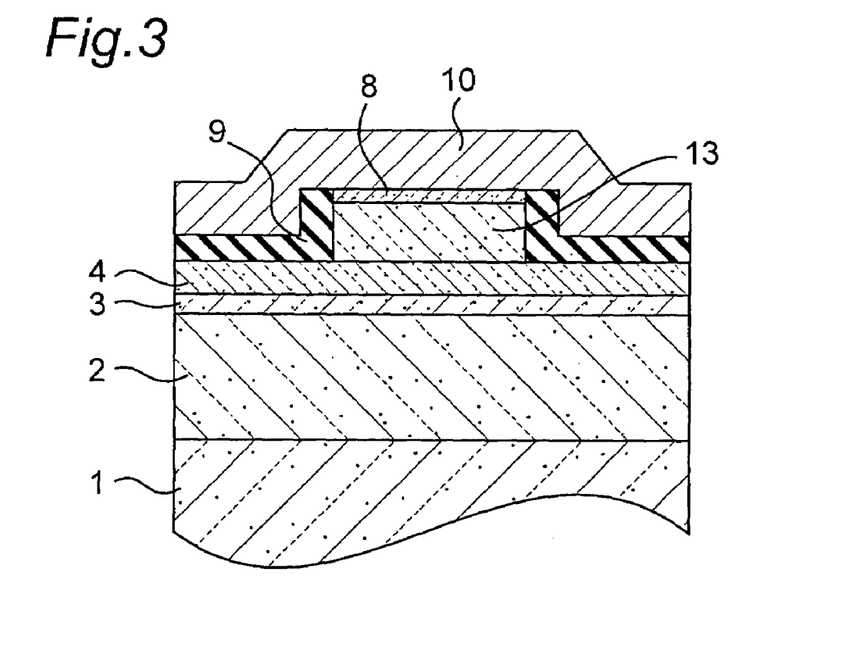
FIG. 3 is a sectional elevation view of a semiconductor laser device according to Embodiment 2 of the present invention.

FIG. 3 is a sectional elevation view of a portion around a light-guiding channel of a semiconductor laser device according to Embodiment 2 of the present invention. As shown in FIG. 3, in the semiconductor laser device, on an n-GaAs substrate 1, an n-AlGaInP clad layer 2, an AlGaInP/GaInP MQW active layer 3, a p-AlGaInP first clad layer 4, a second upper clad layer 13 substantially composed of (or containing) p-$Al_xGa_{1-x}$As (x is an Al composition ratio in the range from 0 to 1) and provided with a stripe-form protrusion 6 (referred to as "p-$Al_xGa_{1-x}$As second clad layer 13" hereinafter), and a p-GaAs contact layer 8 are provided in that order.

In the semiconductor laser device, except the portion corresponding to the stripe-form protrusion 6, the p-$Al_xGa_{1-x}$As second clad layer 13 is covered with an insulative film 9. On the p-GaAs contact layer 8 and the insulative film 9, a p-electrode 10 is provided. Meanwhile, although it is not illustrated, on the lower surface (i.e. back surface) of the n-GaAs substrate 1, an n-electrode is provided. Further, in the vicinity of an end face of the semiconductor laser device, an end-face window region is formed (see FIG. 1).

In a semiconductor laser device according to Embodiment 2, as same as in the case of the semiconductor laser device according to Embodiment 1, when voltage is applied between the p-electrode 10 and the n-electrode and then current exceeding a threshold value flows from the p-electrode 10 to the n-electrode, the laser beam passes the stripe-form light-guiding channel formed in the vicinity of AlGaInP/GaInP MQW active layer 3 below the stripe-form protrusion 6 and then is emitted from the end-face window region to the outside.

Although the p-$Al_xGa_{1-x}$As second clad layer 13 is formed with a material different from that of the p-AlGaInP first clad layer 4 in the semiconductor laser device, its refractive index is nearly equal to that of the p-AlGaInP first clad layer 4. By the reasons same as in the case of Embodiment 1, setting the Al composition ratio x of p-$Al_xGa_{1-x}$As second clad layer 13 to 0.45–0.9 can bring the refractive index of p-$Al_xGa_{1-x}$As nearly equal to that of p-AlGaInP or n-AlGaInP. Thus, in the semiconductor laser device, the Al composition ratio x of p-$Al_xGa_{1-x}$As second clad layer 13 is set to 0.7.

The refractive index n of each of the layers 3, 4 and 13 in the semiconductor laser device is given as follows.

AlGaInP/GaInP MQW active layer 3: n=3.65 (well layer)
p-AlGaInP first clad layer 4: n=3.39
p-$Al_xGa_{1-x}$As second clad layer 13: n=3.38 (x=0.7).

Because in the semiconductor laser device, the p-$Al_xGa_{1-x}$As second clad layer 13 provides a refractive index similar to that of, for example, the regular p-AlGaInP second clad layer 7 (n=3.39) as in the case of Embodiment 1, the light distribution in the semiconductor laser device is of the level similar to that in the case of the regular semiconductor laser device with no etching stopper layer provided (see FIGS. 8 and 9). In consequence, the luminous efficiency is improved as is the case of the regular semiconductor laser device with no etching stopper layer provided (see FIG. 10). Thus, it is assumed that it will become about 7% better than that of the conventional semiconductor laser device provided with the etching stopper layer of MQW structure composed of p-AlGaInP and GaInP. Accordingly, the semiconductor laser device according to Embodiment 2 is advantageous for increasing its output and improving its efficiency.

Furthermore, in the semiconductor laser device according to Embodiment 2, p-$Al_xGa_{1-x}$As which is the material of the p-$Al_xGa_{1-x}$As second clad layer 13 is easier to increase the carrier concentration as compared to p-AlGaInP which is the material of the upper clad layer of the conventional semiconductor laser device. In consequence, by increasing the carrier concentration, the resistance of the stripe-form protrusion 6 of the p-$Al_xGa_{1-x}$As second clad layer 13 can be reduced so that the output characteristics at the time of high temperature or high output can be improved.

As described above, the Al composition ratio x of the p-$Al_xGa_{1-x}$As second clad layer 13 is set to 0.7 in Embodiment 2. However, if the Al composition ratio x is set in a range from 0.45 (n=about 3.57) to 0.9 (n=about 3.24), the same effects may be achieved.

Hereinafter, a manufacturing method of a semiconductor laser device according to Embodiment 2 will be described.

In the manufacturing process of the semiconductor laser device, at first, by a crystal growth method such as the MOCVD method or the like, on an n-GaAs substrate 1, an n-AlGaInP clad layer 2, an AlGaInP/GaInP MQW active layer 3, a p-AlGaInP first clad layer 4, a p-$Al_xGa_{1-x}$As second clad layer 13, and a p-GaAs contact layer 8 are formed in that order. Then, in the vicinity of the end face of the semiconductor laser device, an end-face window region (see FIG. 1) is formed by disordering AlGaInP/GaInP MQW active layer 3 by means of Zn diffusion. Further, by selectively etching the p-$Al_xGa_{1-x}$As second clad layer 13 using a mask having a resist, an insulation film and so on, and provided with a specified pattern, a stripe-form protrusion 6 is formed.

In that occasion, for example, using an etchant of a hydrofluoric acid type, the p-$Al_xGa_{1-x}As$ second clad layer 13 is selectively etched. The etching is nearly stopped when it has reached the p-AlGaInP first clad layer 4. Then, an insulative film 9 such as nitride film or the like is formed. Furthermore, by a photo engraving process and a etching process, the insulative film 9 on the stripe-form protrusion 6 is removed to form an opening. Then, a p-electrode 10 and an n-electrode (see FIG. 1) composed of gold or the like are formed. Thus, the semiconductor laser device is completed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor laser device comprising:
   an active layer;
   a lower cladding layer located on a first side of said active layer;
   a first upper cladding layer located on a second side of said active layer, the second side being opposite the first side of the active layer;
   an etching stopper layer located at said first upper cladding layer on the second side of said active layer; and
   a second upper cladding layer located opposite said etching stopper layer, on the second side of said active layer, and including a stripe protrusion, in which a stripe light-guiding channel is located between said protrusion and said etching stopper layer, wherein
   said etching stopper layer is a single layer of a material including a chemical element different from the chemical elements of each of said lower, first upper, and second upper cladding layers, and has a refractive index within a range that is ±5% of refractive index of each of said lower, first upper, and second upper cladding layers.

2. The semiconductor laser device according to claim 1, wherein said active layer contains GaInP, each of said lower, first upper, and second upper cladding layers contains AlGaInP, and said etching stopper layer contains $Al_xGa_{1-x}As$, where $0<x<1$.

3. The semiconductor laser device according to claim 2, wherein x is at least 0.45.

4. A semiconductor laser device comprising:
   an active layer;
   a lower cladding layer located on a first side of said active layer;
   a first upper cladding layer located on a second side of said active layer, the second side being opposite the first side of the active layer; and
   a second upper cladding layer located on and in contact with said first upper cladding layer, on the second side of said active layer, and including a stripe protrusion, in which a stripe light-guiding channel is located between said protrusion and said second upper cladding layer, wherein said second upper cladding layer is a material different from material of said first upper cladding layer, and has a refractive index within a range ±5% refractive index of said first upper cladding layer.

5. The semiconductor laser device according to claim 4, wherein said active layer contains GaInP, each of said lower cladding layer and said first upper cladding layer contains AlGaInP, and said second upper cladding layer contains $Al_xGa_{1-x}As$, where $0<x<1$.

6. The semiconductor laser device according to claim 5, wherein x is at least 0.45.

7. The semiconductor laser device according to claim 2, wherein x is no more than 0.9.

8. The semiconductor laser device according to claim 7, wherein x is 0.7.

9. The semiconductor laser device according to claim 6, wherein x is no more than 0.9.

10. The semiconductor laser device according to claim 9, wherein x is 0.7.

* * * * *